United States Patent [19]

Yamauchi

[11] Patent Number: 4,783,423
[45] Date of Patent: Nov. 8, 1988

[54] FABRICATION OF A SEMICONDUCTOR DEVICE CONTAINING DEEP EMITTER AND ANOTHER TRANSISTOR WITH SHALLOW DOPED REGION

[75] Inventor: Tunenori Yamauchi, Kawasaki, Japan

[73] Assignee: Fujitsu Limited, Kanagawa, Japan

[21] Appl. No.: 90,419

[22] Filed: Aug. 26, 1987

Related U.S. Application Data

[63] Continuation of Ser. No. 677,140, Nov. 30, 1984, abandoned.

[30] Foreign Application Priority Data

Nov. 30, 1983 [JP] Japan .................. 58-227261

[51] Int. Cl.$^4$ .......................................... H01L 27/04
[52] U.S. Cl. ............................. 437/33; 437/59; 357/43
[58] Field of Search ................... 437/59, 31, 33

[56] References Cited

U.S. PATENT DOCUMENTS

| | | | |
|---|---|---|---|
| 3,594,241 | 1/1968 | Bresee | 148/DIG. 38 |
| 3,667,006 | 5/1972 | Ruegg | 148/DIG. 38 |
| 3,758,831 | 9/1973 | Clark | 357/36 |
| 3,953,255 | 4/1976 | Lombs, Jr. | 148/187 |
| 4,045,784 | 8/1977 | Mayumi et al. | 357/34 |
| 4,089,021 | 5/1978 | Sato et al. | 357/36 |
| 4,133,701 | 1/1979 | Greenstein et al. | 357/34 |
| 4,197,147 | 4/1980 | Bergmann et al. | 29/577 C |
| 4,553,318 | 11/1985 | Chandrasekhar | 437/59 X |
| 4,589,936 | 5/1986 | Komatsu | 148/188 |

OTHER PUBLICATIONS

Fogiel et al. *Modern Microelectronic Circuit Design, IC Application Fabrication Technology*, Research & Education Assoc., 1981.

LeBoss, "Power Transistor Unite MOS, Bipolar" Electronics, vol. 54, No. 7, Apr. 21, 1981.

*Primary Examiner*—Olik Chaudhuri
*Attorney, Agent, or Firm*—Armstrong, Nikaido, Marmelstein & Kubovcik

[57] ABSTRACT

A semiconductor device comprising a deep emitter region having a high withstand voltage between the collector and emitter $V_{CEO}$ and another element comprising a doped region which should be substantially shallower than the deep emitter region, may be fabricated without losing a well controlled current amplification factor $h_{FE}$ and a desired characteristic of the other element owing to the shallow doped region, by using a first dopant having a large diffusion coefficient for doping the emitter region and a second dopant having a small diffusion coefficient for doping the shallow-doped region and by carrying out a heat treatment necessary for doping the first dopant into the deep emitter region after the second dopant has been introduced into the shallow doped region so that no further heat treatment is needed after the first dopant has been doped into the deep emitter region during the process for fabricating the semiconductor device.

27 Claims, 4 Drawing Sheets

FABRICATION OF A SEMICONDUCTOR DEVICE CONTAINING DEEP EMITTER AND ANOTHER TRANSISTOR WITH SHALLOW DOPED REGION

This application is a continuation of application Ser No. 677,140 filed Nov. 30, 1984 now abandoned.

BACKGROUND OF THE INVENTION

1. Field of the Invention

The present invention relates to a process for fabricating a semiconductor device, more specifically, it relates to a process for fabricating a bipolar integrated circuit (IC) which comprises bipolar transistors having a deep emitter region, to obtain a high withstand voltage, and elements having a shallow doped region in a semiconductor substrate. Such elements include a junction type field effect transistor (JFET), a shallow-emitter bipolar transistor, and a static induction transistor (SIT).

2. Description of the Prior Art

In known semiconductor devices, an operation amplifier and the like often comprises JFETs in a former stage and bipolar transistors in a latter stage. Heretofore, an IC for such an operation amplifier and the like has been fabricated by first forming bipolar transistors and then forming JFETs in a semiconductor bulk. The formation of the JFETs comprises at least one heat treatment for forming a channel region and a gate region in the channel region (typically, this treatment comprises a heat diffusion process or annealing after ion implantation). The temperatures used for these heat treatments are usually 800° C. or higher, causing rediffusion of the doped impurity in an emitter region of the bipolar transistors.

In some cases, a bipolar transistor should have a deep emitter region, to obtain a high withstand voltage between the collector and emitter $V_{CEO}$, of generally more than 10 volts, e.g., 30 volts or 40 volts, and a relatively rigid base width or a rigid difference in the depths of the base region and the emitter region, to obtain a sufficient current amplification factor $h_{FE}$, such as 100. However, due to the above-mentioned rediffusion of the doped impurity in the emitter region, the base width, and therefore the current amplification factor $h_{FE}$, are changed. In the former step of forming the bipolar transistors, the current amplification factor may be designed to become, for example, 40, and a current amplification factor $H_{FE}$ of, e.g., approximately 100, may be obtained after the heat treatment in the latter step of forming the JFETs. The precise control of the current amplification factor is, however, difficult in such a process.

Similar problems also occur in a process for fabricating an IC comprising a bipolar transistor having a high withstand voltage $V_{CEO}$ (a deep-emitter bipolar transistor) and a bipolar transistor having a shallow emitter region to obtain a high switching speed of the transistor (a shallow-emitter bipolar transistor), and in a process for fabricating an IC comprising a deep-emitter bipolar transistor and an SIT to obtain an excellent high-frequency characteristic, and the like. That is, the above-mentioned problems occur during a process for fabricating a semiconductor device which comprises a bipolar transistor having a deep emitter region and another element having a shallow doped region in the same semiconductor device, or substrate, the emitter region being substantially deeper than the shallow doped region, if the other element is formed after the bipolar transistor is formed, as is usual in a prior art process.

SUMMARY OF THE INVENTION

The present invention provides a process for fabricating a semiconductor device which includes a bipolar transistor comprising an emitter region and another element comprising a doped region in the same semiconductor bulk, the emitter region being substantially deeper than the doped region. This process comprises the following steps:

1. Introducing a first dopant in a region where the doped region is to be formed; and,
2. After the introducing step, carrying out a heat treatment for a second dopant having a diffusion coefficient larger than that of the first dopant to form the emitter region.

In this process, the heat treatment for forming the deeper emitter region is carried out after the shallow doped region of the other element is formed. In other words, heat treatment is not carried out after the deep emitter region is formed. Therefore, the depth of the deep emitter region, and therefore the base width mentioned before, can be controlled precisely, thus allowing precise control of the current amplification factor $h_{FE}$. The above-mentioned heat treatment for forming the emitter region may be the heat diffusion process or annealing after ion implantation. If the heat treatment used is annealing after ion implantation, the ion implantation alone before annealing for the emitter region may be carried out before, during or after the formation of the other element. Doping to form each of the doped regions of the other element may be made either by heat diffusion or by ion implantation. If ion implantation is used for forming a doped region of the other element, annealing after the ion implantation may be carried out before the heat treatment for forming the emitter region or by the heat treatment itself.

In the specification, the term "heat treatment" means any treatment involving a temperature of 800° C. or higher which can substantially diffuse or rediffuse impurity atoms or ions in a bulk. In a process for fabricating a semiconductor device according to the present invention, such a heat treatment is never used after a deep emitter region in a deep-emitter bipolar transistor has been formed by heat diffusion or annealing after ion implantation involving a temperature of 800° C. or higher.

Another feature of the process according to the present invention is that wherein a dopant for forming a deep emitter region of a bipolar transistor and a dopant for forming a shallow doped region of another element have different diffusion coefficients. The diffusion coefficient of the dopant for a deep emitter region is larger than that for a shallow doped region. This feature allows the prevention of a dopant introduced into a region which should be shallow, from rediffusing and making that region deep when a heat treatment for another dopant of a deep emitter region is carried out. For example, heretofore, phosphorous has been used for doping both a deep emitter region and a shallow doped region such as a gate region of a JFET in the same silicon bulk. However, a channel of a JFET should be thin, to ensure that the JFET has a large mutual conductance $g_m$. If a dopant for a gate region has a larger diffusion coefficient and is subject to a heat treatment for a dopant for a deep emitter region, the resultant gate region also has a deep depth, and will prevent the obtaining of a thin channel region and therefore a large mutual conductance $g_m$. To prevent this, in a process according to the present invention, a dopant having a small diffusion coefficient is used for a shallow doped region of an element and a dopant having a large diffusion coefficient is used for a deep emitter region of a deep-emitter bipolar transistor. In a silicon semiconductor bulk, phosphorous has a relatively large diffusion coefficient and arsenic and antimony have relatively small diffusion coefficients. For example, at 1000° C., phosphorous has a diffusion coefficient of $1.5 \times 10^{-13}$ cm$^2$/sec and arsenic and antimony have coefficients of $1.2 \times 10^{-15}$ cm$^2$/sec and $3.0 \times 10^{-15}$ cm$^2$/sec, respectively.

DESCRIPTION OF THE PREFERRED EMBODIMENTS

In an embodiment of the present invention, a semiconductor device comprising a deep-emitter bipolar transistor and a JFET is fabricated. FIGS. 1 to 6 are sectional views of such a semiconductor device during a process for fabricating this device according to the present invention.

Figure 1:
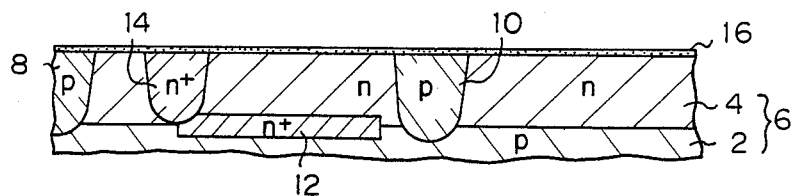
FIGS. 1 to 8 illustrate a process for fabricating a semiconductor device comprising a deep-emitter bipolar transistor and a JFET, according to the present invention.

In FIG. 1, reference numeral 2 denotes a p-type silicon wafer, 4 an n-type epitaxial silicon layer 6 μm to 15 μm thick (hereinafter the p-type silicon wafer 2 and the n-type epitaxial silicon layer 4 or only the n-type epitaxial silicon layer 4 is referred to as "the silicon bulk 6" or "substrate 6" in the specification), 8 and 10 p-type isolation regions, 12 an n+-type buried layer, 14 an n+-type collector contact region, and 16 a surface thin silicon dioxide (SiO$_2$) film having a thickness of 150 nm or less, e.g., 50 nm. The SiO$_2$ film 16 is formed by oxidizing the surface of the silicon substrate 6 after washing that surface.

Figure 2:
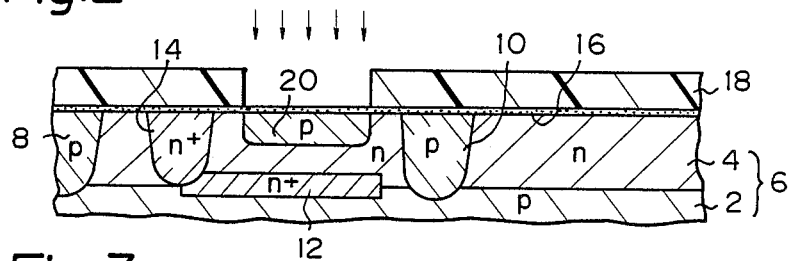

In FIG. 2, a 1 μm thick resist 18 is coated on the SiO$_2$ film 16 and patterned to make an opening. Boron ions are selectively implanted into a region 20 where a p-type base region is to be formed through the opening and the SiO$_2$ film 16 at 60 keV and $5 \times 10^{14}$ cm$^{-2}$. The resist 18 is then removed and a heat treatment is carried out at a temperature of 1100° C. to 1150° C. for 30 minutes.

Figure 3:
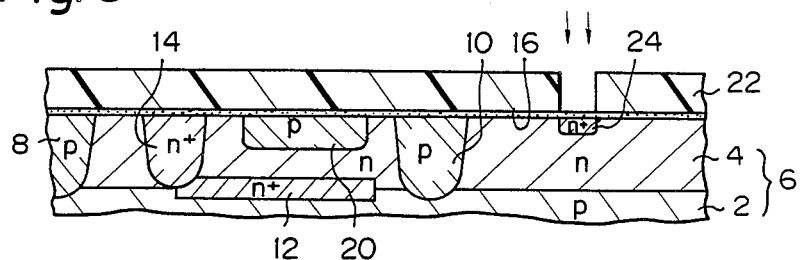

In FIG. 3, using a resist 22 as a mask, arsenic ions are selectively through-implanted into a region 24 where an n+-type gate region is to be formed at 150 keV and $1 \times 10^{13}$ cm$^{-2}$.

Figure 4:
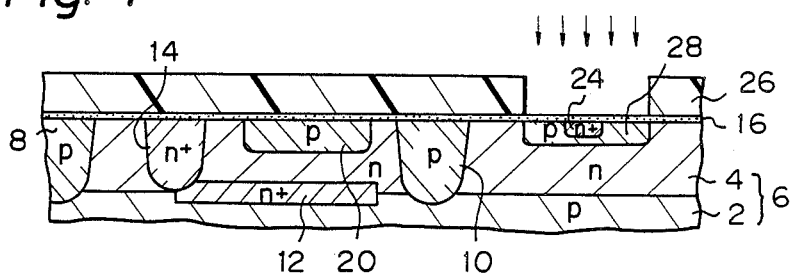

In FIG. 4, using a resist 26 as a mask, boron ions are selectively through-implanted into a region 28 where a p-type channel region is to be formed at 150 keV and $2 \times 10^{12}$ cm$^{-2}$. The process in FIG. 4 may be conducted prior to the process in FIG. 3.

Figure 5:
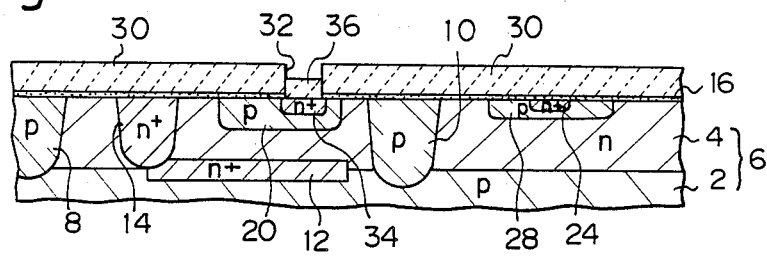

In FIG. 5, after removing the resist 26, an SiO$_2$ layer 30 having a thickness of, e.g., 400 nm, is deposited on the SiO$_2$ film 16 by CVD and a window 32 for emitter diffusion is opened. Using a phosphorous bromide (PBr$_3$) gas as a dopant source, phosphorous is diffused into a region 34 where an n+-type emitter region is to be formed at a temperature of 900° C. to 1000° C. for 30 minutes. In this heat diffusion process, a phosphorous glass layer 36 is simultaneously formed in the window 32, and the ion-implanted channel and gate regions 28 and 24 are annealed.

After this heat diffusion process or a heat treatment, the emitter region 34 has a depth between 0.5 μm and 1 μm, and the base region 20 a depth between 1 μm and 2 μm (the difference in the depth of the emitter and base regions 34 and 20 being between 0.5 μm and 1 μm), the channel region 28 has a depth between 0.3 μm and 0.5 μm, and the gate region 24 a depth between 0.1 μm and 0.2 μm (the difference in the depths of the channel and gate regions 28 and 24 being approximately 0.3 μm). The gate length is approximately 6 μm.

Figure 6:
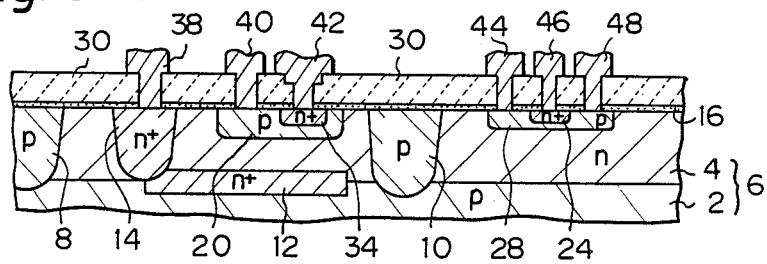

In FIG. 6, electrodes 38, 40, 42, 44, 46, and 48 are formed by opening windows in the SiO$_2$ layer 30 and phosphorous glass layer 36, depositing an aluminum layer, and then patterning the aluminum layer.

The resultant semiconductor device has, for example, a withstand voltage of 40 volts, between the collector and emitter V$_{CEO}$ and a current amplification factor h$_{FE}$ of 100. Further, the yield of such a semiconductor device having the characteristics stated above is very high, since the ability to control the depths of both the deep emitter region 34 and the shallow-gate region 24 is extremely high.

In this embodiment, the emitter region 34 is doped by the heat diffusion process, but it may be doped by ion implantation followed by a heat treatment. In the latter case, the procedures described before with reference to FIGS. 1 to 4 also may be carried out.

Figure 7:
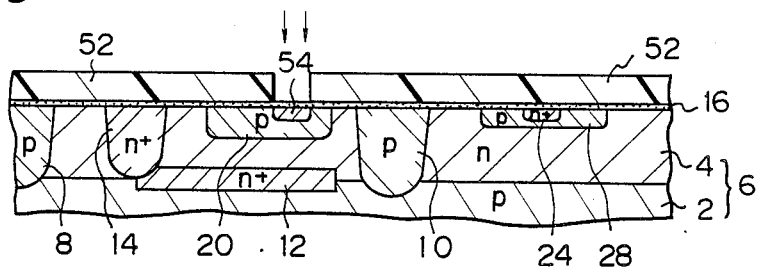
Figure 8:
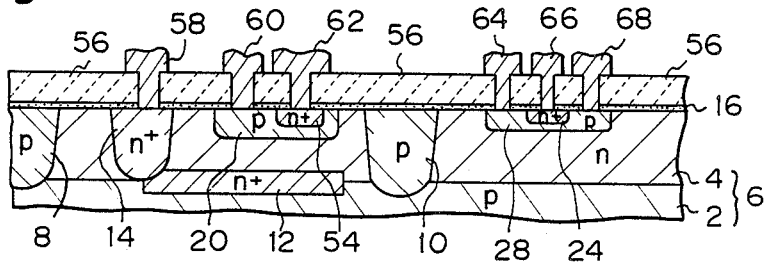

Referring now to FIG. 7, after removing the resist 26 in FIG. 4, using a resist 52 as a mask, phosphorous ions are implanted into a region 54 where an n+-type emitter region is to be formed at 120 keV and $5 \times 10^{15}$ cm$^{-2}$. In FIG. 8, after removing the resist 52, an SiO$_2$ layer 56 having a thickness of, e.g., 400 nm, is deposited entirely on the thin SiO$_2$ film 16 by CVD and electrodes 58, 60, 62, 64, 66, and 68 are formed.

In another embodiment of the present invention, a semicondutor device comprises a deep-emitter bipolar transistor and a shallow-emitter bipolar transistor. FIGS. 9 to 12 illustrate the process for fabricating such a semiconductor device according to the present invention. In these figures, reference numerals indicating parts similar to those in FIGS. 1 to 8 are the same as those in FIGS. 1 to 8.

Figure 9:
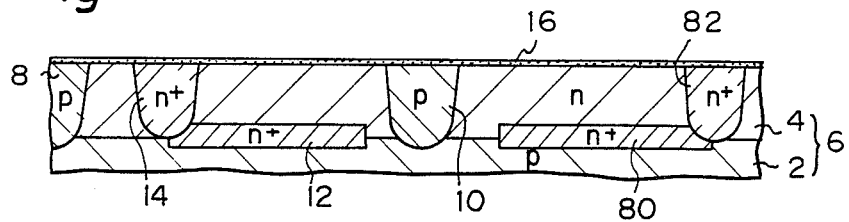
FIGS. 9 to 12 illustrate a process for fabricating a semiducucutor device comprising a deep-emitter bipolar transistor and a shallow-emitter bipolar transistor, according to the present invention.

In FIG. 9, similar to FIG. 1, the reference numeral 2 denotes a p-type silicon wafer, 4 an n-type epitaxial silicon layer, 6 a silicon bulk, 8 and 10 p-type isolation regions, 12 an n+-type buried layer, 14 an n+-type collector contact region, and 16 an SiO$_2$ film. In this embodiment, there are further an n+-type buried layer 80 and an n+-type collector contact region 82.

Figure 10:
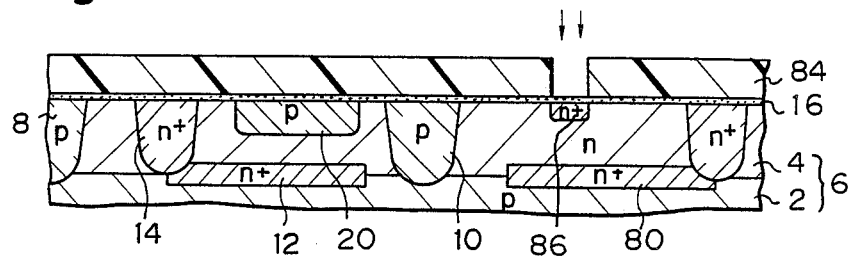

In FIG. 10, after phosphorous ions are implanted into a region 20 where a first p-type base region is to be formed in a procedure similar to that in FIG. 2, arsenic ions are selectively implanted using a resist 84 as a mask into a region 86, where a shallow second n+-type emitter region is to be formed at 150 keV and $1 \times 10^{13}$ to $5 \times 10^{15}$ cm$^{-2}$.

Figure 11:
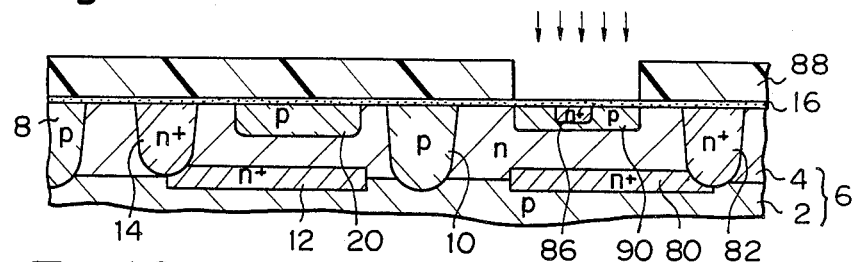

In FIG. 11, using a resist 88 as a mask, boron ions are selectively implanted into a region 90 where a second p-type base region is to be formed at 150 keV and $5\times10^{12}$ to $5\times10^{14}$ cm$^{-2}$. The process in FIG. 11 may be conducted prior to the process in FIG. 10.

Figure 12:
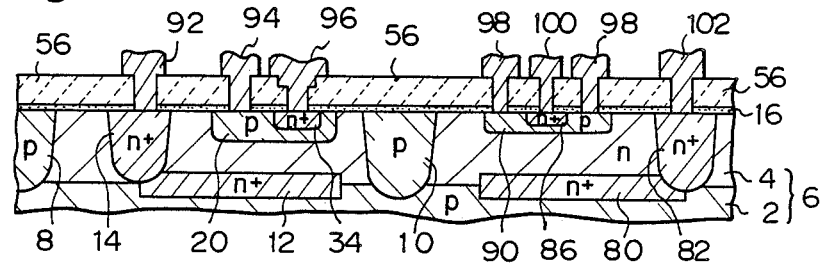

In FIG. 12, selective emitter diffusion is carried out in a procedure similar to that in FIG. 5. After this emitter diffusion, the depths of the first emitter and base regions 20 and 34 and the difference in these depths correspond to those described in the previous embodiment. The depths of the second emitter and base regions 86 and 90 are between 0.1 μm and 0.2 μm and between 0.3 μm and 0.5 μm, respectively. Then, electrodes 92, 94, 96, 98, 100, and 102 are formed.

Alternatively, the first emitter region 34 may be selectively formed by ion implantation followed by annealing. The procedures for such ion implantation and annealing are similar to those described before.

In a further embodiment of the present invention, a semiconductor device comprises a deep-emitter bipolar transistor and an SIT. FIGS. 13 to 16 illustrate such a semiconductor device during a process for fabricating it according to the present invention. In these figures, the same reference numerals are used for similar parts.

Figure 13:
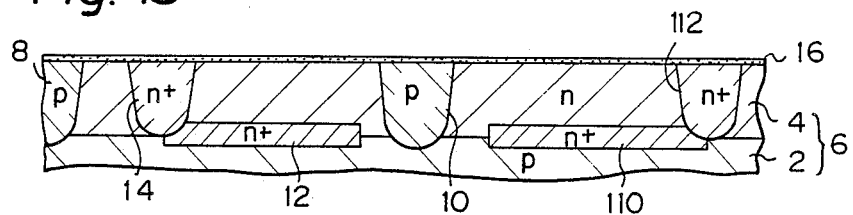
FIGS. 13 to 16 illustrate a process for fabricating a semiconductor device comprising a deep-emitter bipolar transistor and an SIT, according to the present invention.

In FIG. 13, p-type isolation regions 8 and 10, an n$^+$-type buried layer 12, and an n$^+$-type collector contact region are formed in a silicon substrate 6. In this embodiment, there are further an n$^+$-type buried drain region 110 and an n$^+$-type drain contact region 112.

Figure 14:
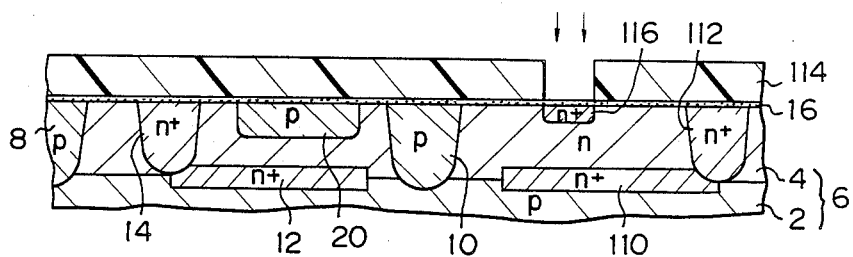

In FIG. 14, after phosphorous ions are implanted into a region 20 where a p-type base region is to be formed in a procedure similar to that in FIG. 2, arsenic ions are selectively implanted, using a resist 114 as a mask, into a region 116 where an n$^+$-type source region is to be formed at 150 keV and $1\times10^{13}$ to $5\times10^{15}$ cm$^{-2}$.

Figure 15:
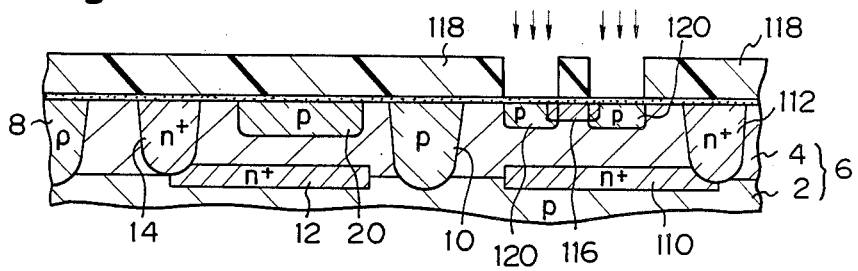

In FIG. 15, using a resist 118 as a mask boron ions are selectively implanted into a region 120 surrounding the region 116 where a p-type gate region is to be formed at 150 keV and $5\times10^{12}$ to $5\times10^{14}$ cm$^{-2}$. The process in FIG. 15 may be conducted prior to the process in FIG. 14.

Figure 16:
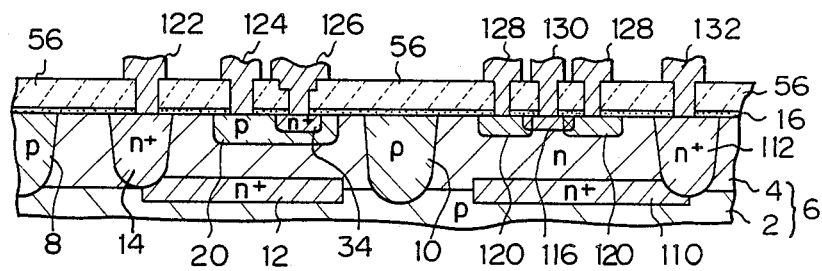

In FIG. 16, phosphorous is heat diffused to form an n$^+$-type emitter region 34 in a procedure similar to that in FIG. 5. After this heat diffusion, which also anneals the source and gate region 116 and 120, the emitter and base regions 34 and 20 have the same depths as those obtained in FIG. 5, and the source and gate regions 116 and 120 have depths between 0.1 μm and 0.2 μm and between 0.3 and 0.5 μm, respectively. Then, electrodes 122, 124, 126, 128, 130, and 132 are formed.

Alternatively, the emitter region may be formed by ion implantation followed by annealing in a procedure similar to that described previously.

In a prior art, for example, if a JFET is formed after a deep-emitter bipolar transistor is formed in the same bulk, and if the deep emitter region is doped by heat diffusion and the gate and channel regions are doped by ion implantation, a window is opened in a relatively thick SiO$_2$ layer which has been used for heat diffusing phosphorous into a deep emitter region and a relatively thin SiO$_2$ film is formed at the surface of a silicon substrate in the window, through which ions are implanted to form channel and gate regions. Channel and gate electrodes are formed on and through the thin SiO$_2$ film, and as a result, the thin SiO$_2$ film remains between the electrodes and the channel and gate regions, decreasing the withstand voltage of the thus fabricated JFET. In contrast, according to the present invention, channel and gate electrodes of a JFET are formed after a deep emitter region is doped. Therefore, even if the deep emitter region is doped by heat diffusion, the channel and gate electrode are formed on and through a relatively thick SiO$_2$ layer which has been used for that heat diffusion, thereby improving the withstand voltage of a JFET.

It should be understood that the above description is exemplificative and illustrative and is not intended to restrict the present invention to any particular example given or shown. For example, the element having a shallow doped region in addition to a deep-emitter bipolar transistor may be other than a JFET, a shallow-emitter bipolar transistor, and an SIT. The gate and/or channel regions 24 and/or 28 in a JFET, the emitter and/or base regions 86 and/or 90, in a shallow-emitter bipolar transistor, and the source and/or gate regions 116 and/or 120 in an SIT may be doped by heat diffusion, and the sequences of forming regions 24 and 28, 86 and 90, and 116 and 120 may be carried out in reverse to those described before with reference to the drawings. The conditions of heat diffusion or ion implantations, the depths of various doped regions, etc. may be varied.

It should be also understood that the present invention may be applied to a semiconductor device comprising a deep-emitter bipolar transistor and two or more shallow doped regions in one or more other element(s), for example, a shallow gate region of a JFET and a shallow emitter region of a shallow-emitter bipolar transistor.

I claim:

1. A process for fabricating a semiconductor, device which includes, in the same semiconductor bulk, a bipolar transistor comprising a base region and an emitter region shallower than said base region, said emitter region being formed in said base region, and a junction field effect transistor comprising a channel region and a gate region shallower than said channel region, said gate region being formed in said channel region, said gate region being substantially shallower than said emitter region, said process comprising the steps of:

introducing a first dopant for forming said gate region and having a first diffusion coefficient into a region where said gate region is to be formed in said semiconductor bulk, said first dopant having a first conductivity type for said semiconductor;

introducing a second dopant for forming said channel region and having a second larger diffusion coefficient into a region where said channel region is to be formed in said semiconductor bulk, said second dopant having a second conductivity type opposite to said first conductivity type;

introducing a third dopant into a region where said base region is formed in said semiconductor bulk, said third dopant having the second conductivity type;

after said three introducing steps, forming an insulating film on said semiconductor bulk including said channel region, gate region and base region;

forming a window in said insulating film on a region where said emitter region is to be formed;

after said three introducing steps and said window forming step, carrying out a heat treatment for a fourth dopant having a diffusion coefficient substantially larger than that of said first dopant and said second dopant to form said emitter region in said semiconductor bulk to a depth substantially deeper than said gate region, the final depths of each of said regions being substantially determined by said heat treatment;

after that forming contact windows in the insulting film for said gate region, channel region and a base region; and forming electrodes in the emitter, base, gate, and channel regions in said windows of the insulting film.

2. A process for fabricating a semiconductor device which includes, in the same semiconductor bulk, a bipolar transistor comprising a base region and an emitter region shallower than said base region, said emitter region being formed in said base region, and a junction field effect transistor comprising a channel region and a gate region shallower than said channel region, said gate region being formed in said channel region, said gate region being substantially shallower than said emitter region, said process comprising the steps of:

introducing a first dopant for forming said gate region and having a first diffusion coefficient into a region where said gate region is to be formed in said semiconductor bulk, said first dopant having a first conductivity type for said semiconductor;

introducing a second dopant into a region where said channel region is to be formed in said semiconductor bulk, said second dopant having a second conductivity type opposite to said first conductivity type;

introducing a third dopant into a region where said base region is formed in said semiconductor bulk, said third dopant having the second conductivity type;

after said three introducing steps, forming an insulating film on said semiconductor bulk including said channel region, gate region, and base region;

forming a window in said insulating film on a region where said emitter region is to be formed;

after said three introducing steps and said window forming step diffusing a fourth dopant having a diffusion coefficient substantially larger than that of said first dopant into the semiconductor substrate by a heat diffusion process to form said emitter region to a depth substantially deeper than said gate region, said first and second dopants thereby also being diffused into said semiconductor bulk to form said gate region and said channel region, respectively, the final depths of each of said regions being substantially determined by said heat diffusion process;

after that, forming contact windows in the insulating film for said gate region, channel region and a base region; and forming electrodes for the emitter, base, gate, and channel regions in said windows of the insulating film.

3. A process according to claim 2, wherein said semiconductor bulk is of silicon.

4. A process according to claim 3, wherein said first dopant is arsenic or antimony.

5. A process according to claim 3, wherein said second dopant is boron.

6. A process according to claim 3, wherein said third dopant is phosphorous.

7. A process according to claim 2, wherein said heat diffusion process of said fourth dopant is carried out at a temperature higher than 800° C.

8. A process according to claim 7, wherein said heat diffusion process of said fourth dopant is carried out at a temperature of 900° C. to 1000° C. for a period of 10 minutes to 1 hour.

9. A process according to claim 2, wherein said first and second dopants are introduced into said regions in said semiconductor bulk by ion implantation and annealed by the heat of said heat diffusion process of said fourth dopant.

10. A process according to claim 2, wherein said first dopant is introduced into said semiconductor bulk by a heat diffusion process.

11. A process according to claim 2, wherein said second dopant is introduced into said semiconductor bulk by a heat diffusion process.

12. A process according to claim 2, wherein said emitter region has a depth in the range of 0.5 $\mu$m to 1 $\mu$m.

13. A process according to claim 2, wherein said gate region has a depth in the range of 0.1 $\mu$m to 0.2 $\mu$m.

14. A process according to claim 2, wherein said channel region has a depth in the range of 0.3 $\mu$m to 0.5 $\mu$m from the top surface of said semiconductor bulk.

15. A process according to claim 2, wherein said channel region has a depth of approximately 0.3 $\mu$m under said gate region.

16. A process according to claim 2, wherein said bipolar transistor comprises a base region of 1 $\mu$m to 2 $\mu$m in depth from the top surface of said semiconductor bulk.

17. A process according to claim 16, wherein said base region has a depth in the range of 0.5 $\mu$m to 1.0 $\mu$m under said emitter region.

18. A process for fabricating a semiconductor device which includes in the same semiconductor bulk, a bipolar transistor comprising a base region and an emitter region shallower than said base region, said emitter region being formed in said base region, and a junction field effect transistor comprising a channel region and a gate region, said gate region being substantially shallower than said emitter region, said process comprising the steps of:

introducing a first dopant for forming said gate region and having a first diffusion coefficient into a region where said gate region is to be formed in a semiconductor bulk, said first dopant having a first conductivity type for said semiconductor introducing a second dopant into a region where said channel region is to be formed in said semiconductor bulk, said gate region being coextensive with said channel region, said second dopant having a second conductivity type opposite to said first conductivity type;

introducing a third dopant into a region where said base region is formed in said semiconductor bulk, said third dopant having the second conductivity type;

after said three introducing steps, forming an insulating film on said semiconductor bulk including said channel region, gate region, and base region;

forming a window in said insulating film on a region where said emitter region is to be formed;

after said three introducing steps and said window forming step, implanting a fourth dopant having a diffusion coefficient substantially larger than that of said first dopant and said second dopant into a region where said emitter region is to be formed in said semiconductor bulk;

after that, carrying out a heat treatment for said fourth dopant to form said emitter region in said semiconductor bulk substantially deeper than said gate region, thereby also diffusing said first and second dopants into said semiconductor bulk, the final depths of each of said regions being substantially determined by said heat treatment;

after that, forming contact windows in the insulating film for said gate region, channel region and a base region; and forming electrodes for the emitter, base, gate, and channel regions in said windows of the insulating film.

19. A process according to claim 18, wherein said semiconductor bulk is of silicon.

20. A process according to claim 19, wherein said first dopant is arsenic or antimony.

21. A process according to claim 19, wherein said second dopant is boron.

22. A process according to claim 19, wherein said third dopant is phosphorous.

23. A process according to claim 18, wherein said heat treatment for said fourth dopant is carried out at a temperature higher than 800° C.

24. A process according to claim 23, wherein said heat treatment for said fourth dopant is carried out at a temperature of 1000° C. to 1050° C. for a period of 10 minutes to 1 hour.

25. A process according to claim 18, wherein said first and second dopants are introduced into said regions in said semiconductor bulk by ion implantation and annealed simultaneously with and by said heat treatment for said fourth dopant.

26. A process according to claim 18, wherein said first dopant is introduced into said semiconductor bulk by a heat diffusion process.

27. A process according to claim 18, wherein said second dopant is introduced into said semiconductor bulk by a heat diffusion process.

* * * * *